(12) United States Patent
Sato et al.

(10) Patent No.: US 12,080,781 B2
(45) Date of Patent: Sep. 3, 2024

(54) FABRICATION OF THIN FILM FIN TRANSISTOR STRUCTURE

(71) Applicant: Intel Corporation, Santa Clara, CA (US)

(72) Inventors: Noriyuki Sato, Hillsboro, OR (US);
Sarah Atanasov, Beaverton, OR (US);
Abhishek A. Sharma, Portland, OR (US); Bernhard Sell, Portland, OR (US); Chieh-Jen Ku, Hillsboro, OR (US); Elliot N. Tan, Portland, OR (US);
Hui Jae Yoo, Portland, OR (US);
Travis W. Lajoie, Forest Grove, OR (US); Van H. Le, Portland, OR (US);
Pei-Hua Wang, Beaverton, OR (US);
Jason Peck, Hillsboro, OR (US);
Tobias Brown-Heft, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 681 days.

(21) Appl. No.: 17/129,867

(22) Filed: Dec. 21, 2020

(65) Prior Publication Data

US 2022/0199807 A1 Jun. 23, 2022

(51) Int. Cl.
*H01L 29/66* (2006.01)
*H01L 21/8234* (2006.01)
*H01L 27/092* (2006.01)

(52) U.S. Cl.
CPC ......... *H01L 29/66795* (2013.01); *H01L 21/823431* (2013.01); *H01L 27/0924* (2013.01)

(58) Field of Classification Search
CPC ....... H01L 29/66795; H01L 21/823431; H01L 27/0924; H01L 29/66787; H01L 29/785; H01L 29/7831; H01L 25/071; H01L 25/072
See application file for complete search history.

(56) References Cited

U.S. PATENT DOCUMENTS

| 5,309,010 A | | 5/1994 | Kitajima | |
|---|---|---|---|---|
| 5,607,865 A | * | 3/1997 | Choi | .................. H01L 29/7854 438/164 |
| 6,069,390 A | * | 5/2000 | Hsu | ...................... H01L 29/785 257/E27.06 |

(Continued)

OTHER PUBLICATIONS

Search Report from European Patent Application No. 21198468.7, mailed Mar. 2, 2022, 7 pgs.

(Continued)

*Primary Examiner* — Karen Kusumakar
*Assistant Examiner* — Adam S Bowen
(74) *Attorney, Agent, or Firm* — Schwabe, Williamson & Wyatt, P.C.

(57) ABSTRACT

Thin film transistors fabricated using a spacer as a fin are described. In an example, a method of forming a fin transistor structure includes patterning a plurality of backbone pillars on a semiconductor substrate. The method may then include conformally depositing a spacer layer over the plurality of backbone pillars and the semiconductor substrate. A spacer etch of the spacer layer is then performed to leave a sidewall of the spacer layer on a backbone pillar to form a fin of the fin transistor structure. Other embodiments may be described and claimed.

15 Claims, 8 Drawing Sheets

(56) References Cited

U.S. PATENT DOCUMENTS

| | | | |
|---|---|---|---|
| 2006/0068596 A1* | 3/2006 | Dobuzinsky | H01L 21/3081 |
| | | | 257/E21.235 |
| 2015/0303299 A1* | 10/2015 | Chang | H01L 21/02568 |
| | | | 257/29 |
| 2015/0364592 A1 | 12/2015 | Van Dal | |
| 2019/0109063 A1* | 4/2019 | Chew | H01L 25/50 |

OTHER PUBLICATIONS

Office Action from European Patent Application No. 21198468.7, mailed Jul. 4, 2024, 7 pgs.

\* cited by examiner

FABRICATION OF THIN FILM FIN TRANSISTOR STRUCTURE

TECHNICAL FIELD

Embodiments of the disclosure are in the field of integrated circuit structures and, in particular, thin film fin transistors fabricated using a spacer as a fin.

BACKGROUND

For the past several decades, the scaling of features in integrated circuits has been a driving force behind an ever-growing semiconductor industry. Scaling to smaller and smaller features enables increased densities of functional units on the limited real estate of semiconductor chips. For example, shrinking transistor size allows for the incorporation of an increased number of memory or logic devices on a chip, lending to the fabrication of products with increased capacity. The drive for ever-more capacity, however, is not without issue. The necessity to optimize the performance of each device becomes increasingly significant. As a further example, to better control channel current flow in transistors, one method includes to raise the channel above the plane of the silicon, creating a raised fin, e.g., such as tri-gate transistors including finFETs and other 3D transistors. Conventional methods of manufacturing the fins, however, have their drawbacks.

DESCRIPTION OF THE EMBODIMENTS

Thin film transistor structures fabricated using a spacer as a fin are described. In embodiments, fins are formed of a sidewall of channel material remaining after a spacer etch. In the following description, numerous specific details are set forth, such as specific material and tooling regimes, in order to provide a thorough understanding of embodiments of the present disclosure. It will be apparent to one skilled in the art that embodiments of the present disclosure may be practiced without these specific details. In other instances, well-known features, are not described in detail in order to not unnecessarily obscure embodiments of the present disclosure. Furthermore, it is to be understood that the various embodiments shown in the Figures are illustrative representations and are not necessarily drawn to scale. In some cases, various operations will be described as multiple discrete operations, in turn, in a manner that is most helpful in understanding the present disclosure, however, the order of description should not be construed to imply that these operations are necessarily order dependent. In particular, these operations need not be performed in the order of presentation.

Certain terminology may also be used in the following description for the purpose of reference only, and thus are not intended to be limiting. For example, terms such as "upper", "lower", "above", "below," "bottom," and "top" refer to directions in the drawings to which reference is made. Terms such as "front", "back", "rear", and "side" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

One or more embodiments described herein are directed to fin transistor device architectures. One or more embodiments described herein are directed to structures and architectures for fabricating TFT fin structures using a spacer as a fin.

In conventional fin fabrication processes, deposition of a relatively thick channel material may be required in order to fabricate a tall or vertical fin on a substrate. In such processes, a width of a fin may highly depend on the dry etch process which may offer less control than desired. Advantages to implementing embodiments described herein can include the ability to control the width of a fin by deposition of channel material (e.g. atomic layer deposition (ALD) or chemical vapor deposition (CVD)). Accordingly, width or height variation across an individual fin and/or across a plurality of fins on a wafer may be significantly smaller than when using conventional methods.

In an exemplary processing scheme, FIGS. 1A-1D illustrate cross-sectional views representing various operations in a method of fabricating an integrated circuit structure that includes a fin formed of a sidewall of channel material after a spacer etch, in accordance with an embodiment of the present disclosure. In embodiments, FIGS. 1B-1D may include same or similar elements as introduced in FIG. 1A and as such, for purposes of clarity only certain elements will be reintroduced.

Figure 1A:
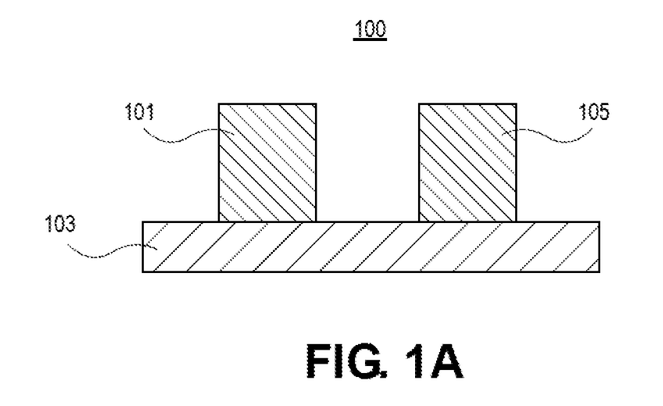
FIGS. 1A-1D illustrate cross-sectional views representing various operations in a method of fabricating an integrated circuit structure that includes a fin formed of a sidewall of channel material after a spacer etch, in accordance with an embodiment of the present disclosure.

Referring to FIG. 1A, a starting integrated circuit structure 100 includes a plurality of backbone pillars that have been patterned and formed over a substrate using photoresist (PR) deposition and lithography. In particular, as shown, backbone (BB) pillars 101 and 105 are formed on an underlayer (UL) 103 over a substrate, such as a silicon substrate of a wafer (shown and discussed with respect to FIG. 5). In embodiments, UL 103 includes an etch-stop layer. In embodiments, UL 103 includes one or more materials selected from silicon nitride (SiN), silicon (Si), silicon carbide (SiC), silicon oxide (SiO$_2$), silicon oxynitride SiON, carbon-doped oxide (CDO) aluminum oxide (Al2O3), hafnium oxide (HfO2), zirconium oxide (ZrO2), aluminum nitride (AlN), zirconium nitride (ZrN), hafnium nitride (HfN). In embodiments, BB pillars 101 and 105 includes a material comprising of one or more of silicon, silicon nitride (SiN). silicon oxide (SiO$_2$), carbon, silicon carbide (SiC), silicon oxynitride (SiON), and carbon doped oxide (CDO).

Figure 1B:
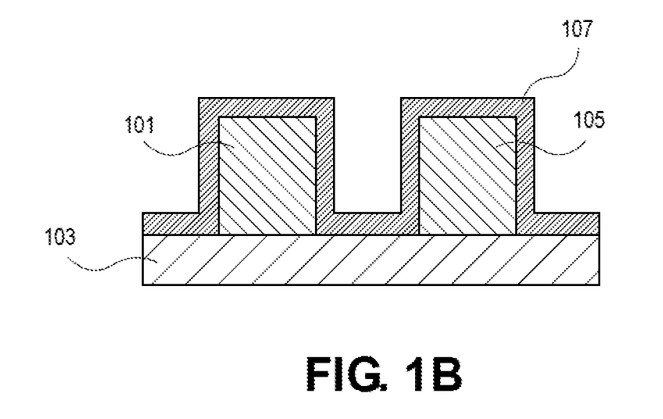

Referring to FIG. 1B, a channel material is then conformally deposited over backbone pillars 101 and 105. In particular, the channel material is used as a spacer or spacer layer 107. In some embodiments, the channel material may include semiconductor material systems including, for example, n-type or p-type materials systems. The channel material may include a semiconductor material (e.g., an oxide semiconductor material). In some embodiments, the channel material may include indium, gallium, zinc, and oxygen (e.g., in the form of indium gallium zinc oxide (InGZO)). In some embodiments, the channel material may include tin and oxygen (e.g., in the form of tin oxide); antimony and oxygen (e.g., in the form of antimony oxide); indium and oxygen (e.g., in the form of indium oxide); indium, tin, and oxygen (e.g., in the form of indium tin oxide); titanium and oxygen (e.g., in the form of titanium oxide); zinc and oxygen (e.g., in the form of zinc oxide); indium, zinc, and oxygen (e.g., in the form of indium zinc oxide); gallium and oxygen (e.g., in the form of gallium oxide); titanium, oxygen, and nitrogen (e.g., in the form of titanium oxynitride); ruthenium and oxygen (e.g., in the form of ruthenium oxide); or tungsten and oxygen (e.g., in the form of tungsten oxide).

Figure 1C:
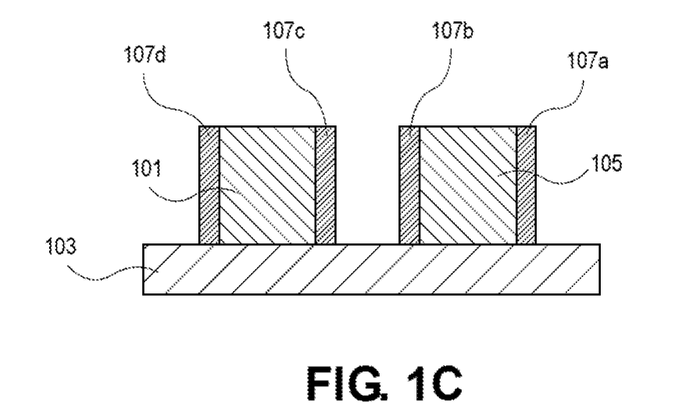

Referring to FIG. 1C, spacer etch of spacer layer 107 is performed. In particular, performing the spacer etch of spacer layer 107 leaves sidewalls 107a, 107b, 107c, and 107d, which form vertical fin structures, or fins. In embodiments, as noted above, spacer layer 107 is made of a channel material. Note that sidewalls 107a and 107b remain as sidewalls of BB pillar 105 while sidewalls 107c and 107d remain of sidewalls of BB pillar 101.

Figure 1D:
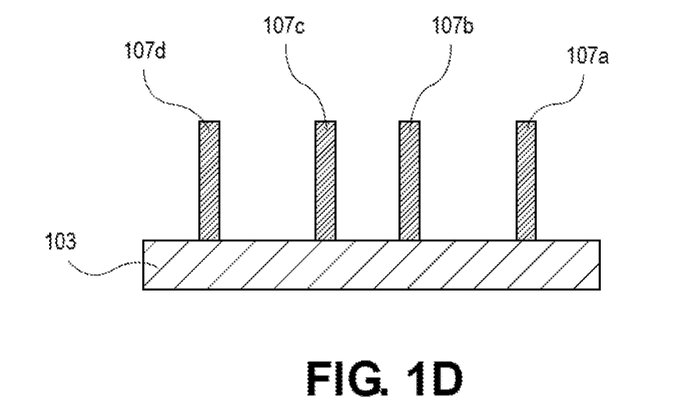

Referring now to FIG. 1D, etching the plurality of BB pillars to remove the BB pillars is performed. As shown in the FIG. 1D, BB pillars 101 and 105 have been removed. Accordingly each of a plurality of sidewalls 107a, 107b, 107c, and 107d, which forms each of a plurality fins (also referred to as "fins 107a, 107b, 107c, and 107d") remain standing. Note that in other embodiments, as will be further discussed with respect to FIG. 3, a plurality of backbone pillars are not etched or removed.

Figure 2A:
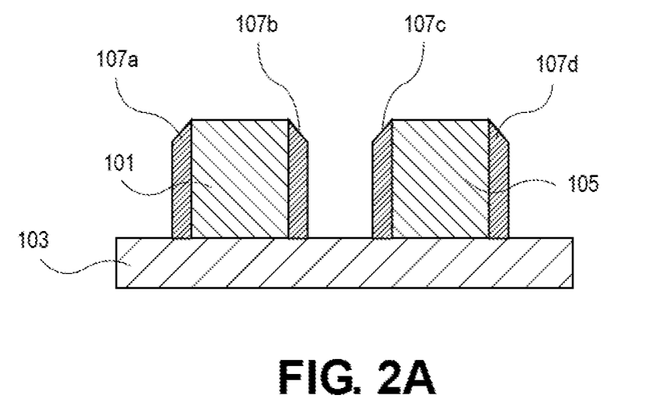
FIGS. 2A and 2B, illustrate cross-sectional views of the integrated circuit structure of FIGS. 1A-1D having fins where a top surface are asymmetrical, in accordance with embodiments of the present disclosure.
Figure 2B:
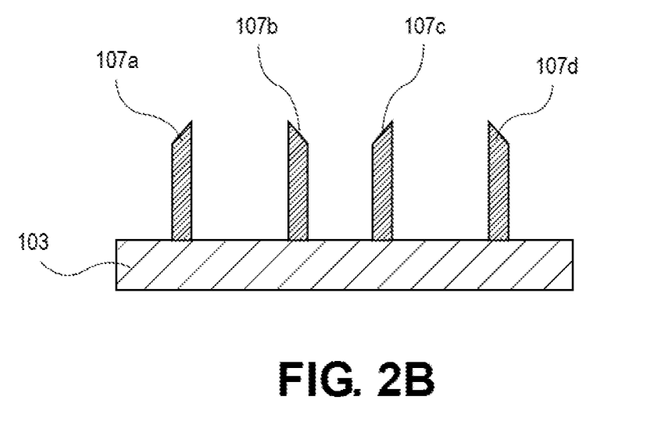

Referring now to FIGS. 2A and 2B, which illustrate cross-sectional views of the integrated circuit structure of FIGS. 1A-1D, where the integrated circuit structures have fins having an asymmetrical top surface, in accordance with embodiments of the present disclosure. In embodiments, a height of one or more fins is sloped across a top surface. In embodiments, the height of the fin is higher on a side facing a location or former location (e.g., in embodiments where BB pillars are removed as in FIG. 1D). Accordingly, FIG. 2A is identical to FIG. 1C, with the exception that fins 107a, 107b, 107c, and 107d have top surfaces that are higher facing corresponding outside surfaces of respective BB pillars 101 and 105. Thus, in FIG. 2B, top surfaces of fins 107a and 107b are higher on sides facing a former location of corresponding BB pillar 101. Similarly, the top surfaces of fins 107c and 107d are higher on sides facing a former location of corresponding BB pillar 105. In embodiments, the top surfaces of the fins are higher on one side due to etching related to downstream processing. In various embodiments, BB pillars 101 and 105 protect an inside surface of fins e.g. fins 107a, 107b, 107c, and 107d, thus leading to an asymmetrical height.

Figure 3:
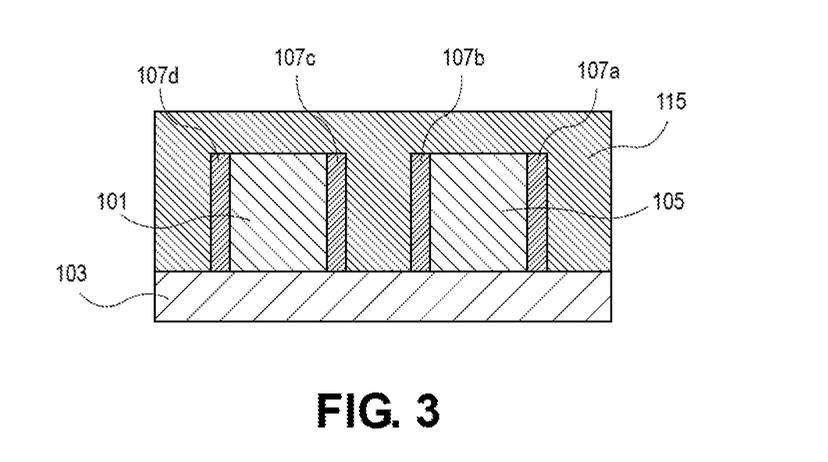
FIG. 3 illustrates a cross-sectional view of an integrated circuit structure including backbone pillars that provide support for a plurality of fins, in accordance with embodiments of the present disclosure.

Next, FIG. 3 illustrates an embodiment where backbone pillars 101 and 105 remain in an integrated circuit structure to provide support for a plurality of fins. In embodiments, etching the BB pillars (as described in connection with FIG. 1D) has not occurred. FIG. 3 is identical to FIG. 1C, with the exception that inter-layer dielectric (ILD) 115 is deposited over BB pillars 101, 105, and fins 107a-107d. Note that plurality of fins 107a, 107b, 107c, and 107d each have a consistent top surface height. In various other embodiments, each of the plurality of fins may have an asymmetrical height as shown and described in connection with FIGS. 2A and 2B.

In an embodiment, ILD materials described herein are composed of or include a layer of a dielectric or insulating material. Examples of suitable dielectric materials include, but are not limited to, oxides of silicon (e.g., silicon dioxide (SiO$_2$)), doped oxides of silicon, fluorinated oxides of silicon, carbon doped oxides of silicon, various low-k dielectric materials known in the arts, and combinations thereof. The interlayer dielectric material may be formed by conventional techniques, such as, for example, chemical vapor deposition (CVD), physical vapor deposition (PVD), or by other deposition methods.

Figure 4:
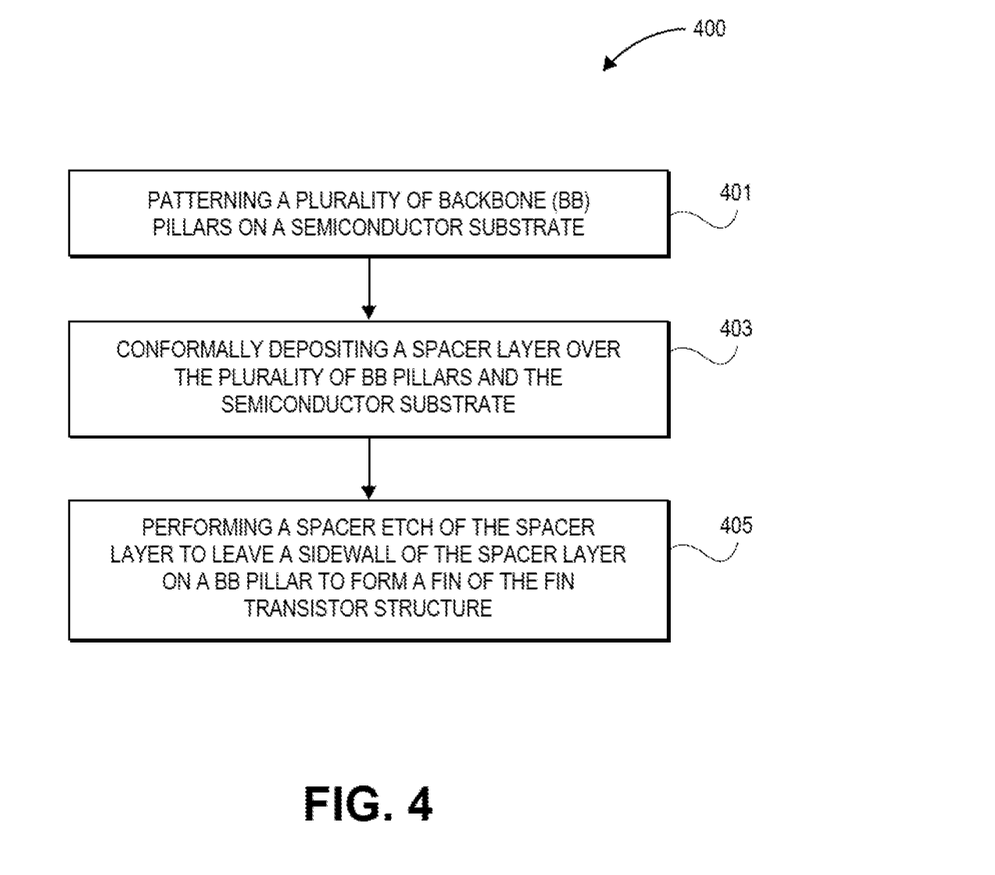
FIG. 4 is a flow diagram illustrating a method associated with FIGS. 1-3, in accordance with embodiments of the present disclosure.

Referring now to FIG. 4, which is a flow diagram illustrating a method associated with FIGS. 1-3, in accordance with embodiments of the present disclosure. At beginning block 401, method 400 includes patterning a plurality of backbone (BB) pillars on a semiconductor substrate. For example, as discussed in connection with FIG. 3, patterning the plurality of BB pillars may include patterning the plurality of backbone pillars on an etch stop layer over the semiconductor substrate. In embodiments, at a next block 403, method 400 includes conformally depositing a spacer or spacer layer over the plurality of BB pillars and the semiconductor substrate. In embodiments, conformally depositing the spacer layer includes conformally depositing a channel material. At a block 405, method 400 then includes performing a spacer etch of the spacer layer to leave a side wall of the spacer layer on a BB pillar to form a fin of the fin transistor structure. In some embodiments, after performing the spacer etch of the spacer layer, a method may further include etching the plurality of BB pillars to substantially remove the BB pillars (e.g., FIG. 2B). In other embodiments, a method may further include allowing the plurality of BB pillars to remain as a support for the fin formed of the sidewall of the spacer layer (e.g., FIG. 3). In embodiments, allowing the plurality of backbone pillars to remain assists in avoiding pattern collapse during further downstream processing.

In an embodiment, as is also used throughout the present description, lithographic operations are performed using 193 nm immersion lithography (i193), extreme ultra-violet (EUV) and/or electron beam direct write (EBDW) lithography, or the like. A positive tone or a negative tone resist may be used. In one embodiment, a lithographic mask is a trilayer mask composed of a topographic masking portion, an anti-reflective coating (ARC) layer, and a photoresist layer. In a particular such embodiment, the topographic masking portion is a carbon hardmask (CHM) layer and the anti-reflective coating layer is a silicon ARC layer.

In another aspect, the integrated circuit structures described herein may be included in an electronic device. As a first example of an apparatus that may include one or more of the TFTs fabricated using a spacer as a fin (e.g., a fin formed of a sidewall of channel material after a spacer etch) as disclosed herein, FIGS. 5A and 5B are top views of a wafer and dies that include one or more TFTs using a spacer as a fin, in accordance with any of the embodiments disclosed herein.

Figures 5A, 5B:
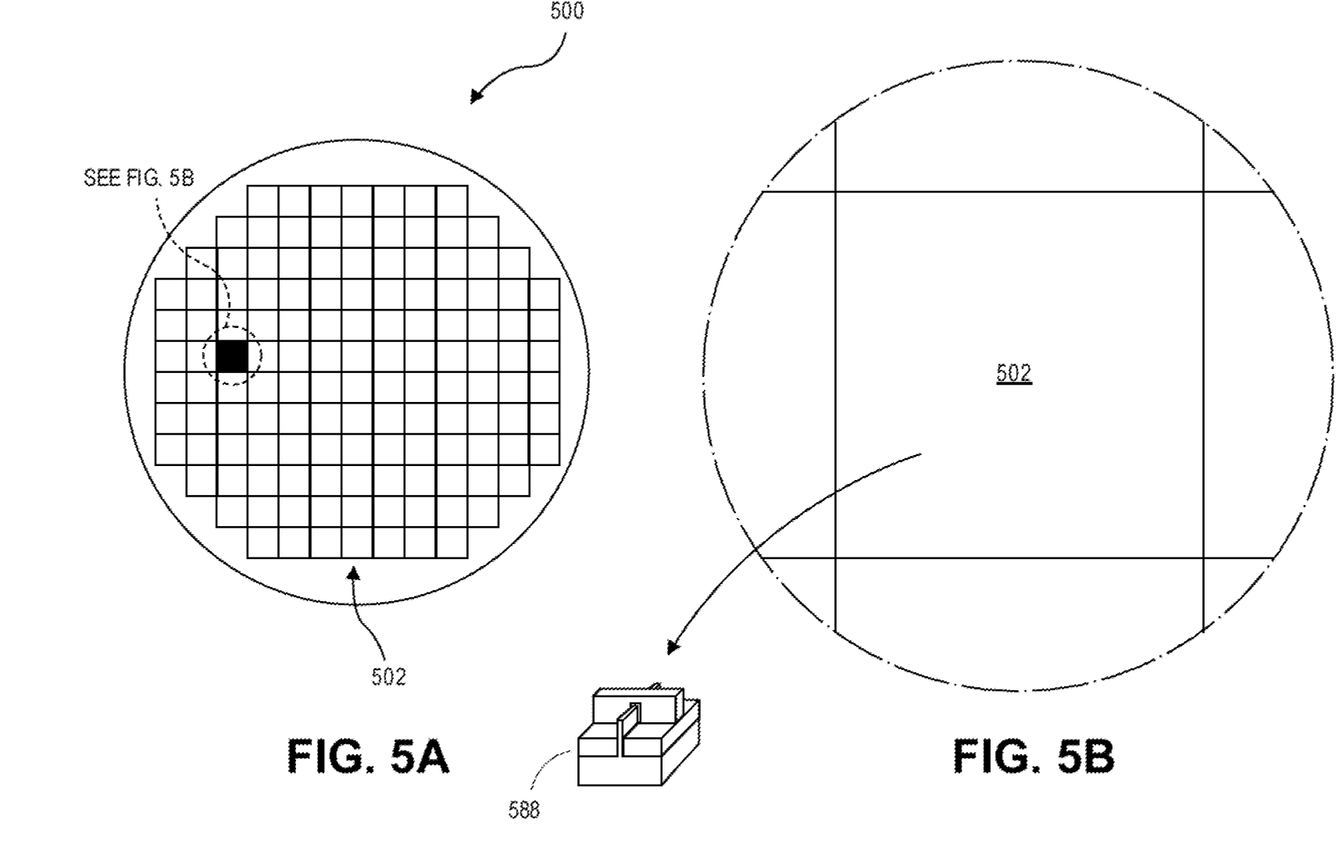
FIGS. 5A and 5B are top views of a wafer and dies that include one or more thin film transistors (TFTs) using a spacer as a fin, in accordance with one or more of the embodiments disclosed herein.

Referring to FIGS. 5A and 5B, a wafer 500 may be composed of semiconductor material and may include one or more dies 502 having integrated circuit (IC) structures formed on a surface of the wafer 500. Each of the dies 502 may be a repeating unit of a semiconductor product that includes any suitable IC (e.g., ICs including a fin-based transistor 588 that may include one or more structures such as IC structures 100 of FIGS. 1A-1D and IC structures of FIGS. 2A/2B and 3). After the fabrication of the semiconductor product is complete (e.g., ICs that includes structures 100 of FIGS. 1A-1D and/or corresponding IC structures of FIGS. 2A/2B and 3), the wafer 500 may undergo a singulation process in which each of the dies 502 is separated from one another to provide discrete "chips" of the semiconductor product. In particular, devices as disclosed herein may take the form of the wafer 500 (e.g., not singulated) or the form of the die 502 (e.g., singulated). The die 502 may include one or more transistors and/or supporting circuitry to route electrical signals to the transistors, as well as any other IC components. In embodiments, the one or more transistors includes a fin-based transistor (e.g., 588) fabricated using a spacer as a fin. In some embodiments, the wafer 500 or the die 502 may include a memory device (e.g., a static random access memory (SRAM) device), a logic device (e.g., an AND, OR, NAND, or NOR gate), or any other suitable circuit element. Multiple ones of these devices may be combined on a single die 502. For example, a memory array formed by multiple memory devices may be formed on a same die 502 as a processing device or other logic that is configured to store information in the memory devices or execute instructions stored in the memory array.

Implementations of embodiments of the invention may be formed or carried out on a substrate of the wafer 500, such as a semiconductor substrate. In one implementation, the semiconductor substrate may be a crystalline substrate formed using a bulk silicon or a silicon-on-insulator substructure. In other implementations, the semiconductor substrate may be formed using alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-V or group IV materials. Although a few examples of materials from which the substrate may be formed are described here, any material that may serve as a foundation upon which a semiconductor device may be built falls within the spirit and scope of the present invention.

As noted above, plurality of transistors, such as metal-oxide-semiconductor field-effect transistors (MOSFET or simply MOS transistors), may be fabricated on the substrate. In various implementations of the invention, the MOS transistors may be planar transistors, nonplanar transistors, or a combination of both. Nonplanar transistors include fin transistors such as described above (e.g., 588) and may include double-gate transistors and tri-gate transistors, and wrap-around or all-around gate transistors such as nanoribbon and nanowire transistors.

Each MOS transistor includes a gate stack formed of at least two layers, a gate dielectric layer and a gate electrode layer. The gate dielectric layer may include one layer or a stack of layers. The one or more layers may include silicon oxide, silicon dioxide ($SiO_2$) and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric layer include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer to improve its quality when a high-k material is used.

The gate electrode layer is formed on the gate dielectric layer and may consist of at least one P-type workfunction metal or N-type workfunction metal, depending on whether the transistor is to be a PMOS or an NMOS transistor. In some implementations, the gate electrode layer may consist of a stack of two or more metal layers, where one or more metal layers are workfunction metal layers and at least one metal layer is a fill metal layer.

For a PMOS transistor, metals that may be used for the gate electrode include, but are not limited to, ruthenium, palladium, platinum, cobalt, nickel, and conductive metal oxides, e.g., ruthenium oxide. A P-type metal layer will enable the formation of a PMOS gate electrode with a workfunction that is between about 4.9 eV and about 5.2 eV. For an NMOS transistor, metals that may be used for the gate electrode include, but are not limited to, hafnium, zirconium, titanium, tantalum, aluminum, alloys of these metals, and carbides of these metals such as hafnium carbide, zirconium carbide, titanium carbide, tantalum carbide, and aluminum carbide. An N-type metal layer will enable the formation of an NMOS gate electrode with a workfunction that is between about 3.9 eV and about 4.2 eV.

In some implementations, the gate electrode may consist of a "U"-shaped structure that includes a bottom portion substantially parallel to the surface of the substrate and two sidewall portions that are substantially perpendicular to the top surface of the substrate. In another implementation, at least one of the metal layers that form the gate electrode may simply be a planar layer that is substantially parallel to the top surface of the substrate and does not include sidewall portions substantially perpendicular to the top surface of the substrate. In further implementations of the invention, the gate electrode may consist of a combination of U-shaped structures and planar, non-U-shaped structures. For example, the gate electrode may consist of one or more U-shaped metal layers formed atop one or more planar, non-U-shaped layers.

As is well known in the art, source and drain regions are formed within the substrate adjacent to the gate stack of each MOS transistor. The source and drain regions are generally formed using either an implantation/diffusion process or an etching/deposition process. In the former process, dopants such as boron, aluminum, antimony, phosphorous, or arsenic may be ion-implanted into the substrate to form the source and drain regions. An annealing process that activates the dopants and causes them to diffuse further into the substrate typically follows the ion implantation process. In the latter process, the substrate may first be etched to form recesses at the locations of the source and drain regions. An epitaxial deposition process may then be carried out to fill the recesses with material that is used to fabricate the source and drain regions. In some implementations, the source and drain regions may be fabricated using a silicon alloy such as silicon germanium or silicon carbide. In some implementations the epitaxially deposited silicon alloy may be doped in situ with dopants such as boron, arsenic, or phosphorous. In further embodiments, the source and drain regions may be formed using one or more alternate semiconductor materials such as germanium or a group III-V material or alloy. And in further embodiments, one or more layers of metal and/or metal alloys may be used to form the source and drain regions.

One or more interlayer dielectrics (ILD) are deposited over the MOS transistors (similar to as described in connection with FIG. 3). The ILD layers may be formed using dielectric materials known for their applicability in integrated circuit structures, such as low-k dielectric materials. Examples of dielectric materials that may be used include, but are not limited to, silicon dioxide ($SiO_2$), carbon doped oxide (CDO), silicon nitride, organic polymers such as perfluorocyclobutane or polytetrafluoroethylene, fluorosilicate glass (FSG), and organosilicates such as silsesquioxane, siloxane, or organosilicate glass. The ILD layers may include pores or air gaps to further reduce their dielectric constant.

Figure 6:
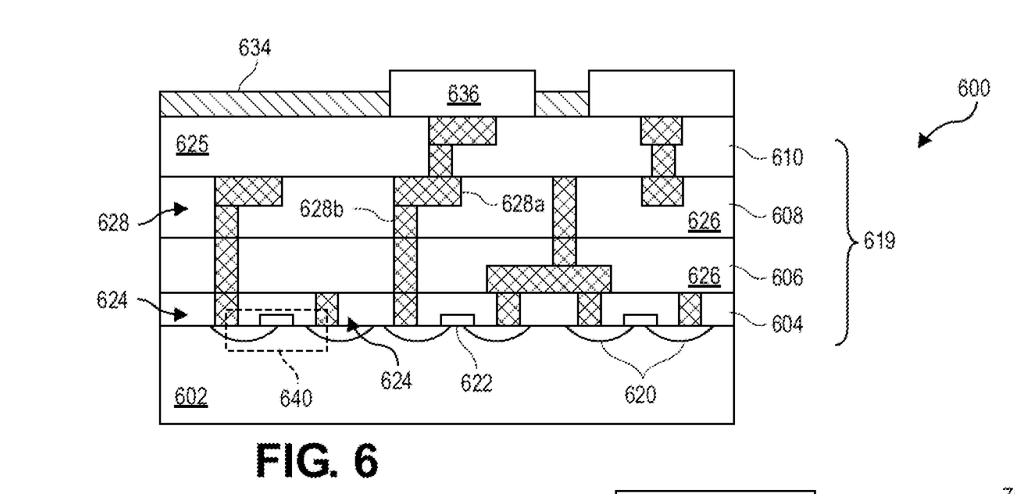
FIG. 6 is a cross-sectional side view of an integrated circuit (IC) device that may include one or more TFTs fabricated using a spacer as a fin, in accordance with one or more of the embodiments disclosed herein.

FIG. 6 is a cross-sectional side view of an integrated circuit (IC) device that may include one or more thin film transistors fabricated using a spacer as a fin, in accordance with one or more of the embodiments disclosed herein.

Referring to FIG. 6, an IC device 600 is formed on a substrate 602 (e.g., the wafer 500 of FIG. 5A) and may be included in a die (e.g., the die 502 of FIG. 5B), which may be singulated or included in a wafer. Although a few examples of materials from which the substrate 602 may be formed are described below, any material that may serve as a foundation for an IC device 600 may be used.

The IC device 600 may include one or more device layers, such as device layer 604, disposed on the substrate 602. The device layer 604 may include features of one or more transistors 640 (e.g., TFTs using a spacer as fin as described above) formed on the substrate 602. The device layer 604 may include, for example, one or more source and/or drain (S/D) regions 620, a gate 622 to control current flow in the transistors 640 between the S/D regions 620, and one or more S/D contacts 624 to route electrical signals to/from the S/D regions 620. The transistors 640 may include additional features not depicted for the sake of clarity, such as device isolation regions, gate contacts, and the like. The transistors 640 are not limited to the type and configuration depicted in FIG. 6 and include a wide variety of other types and configurations such as, for example, planar transistors, non-planar transistors, or a combination of both. Non-planar transistors may include Fin-based transistors (using a spacer as fin as described above in connection with FIGS. 1-5), such as double-gate transistors or tri-gate transistors, and wrap-around or all-around gate transistors, such as nanoribbon and nanowire transistors. Electrical signals, such as power and/or input/output (I/O) signals, may be routed to and/or from the transistors 640 of the device layer 604 through one or more interconnect layers disposed on the device layer 604 (illustrated in FIG. 6 as interconnect layers 606-610). For example, electrically conductive features of the device layer 604 (e.g., the gate 622 and the S/D contacts 624) may be electrically coupled with the interconnect structures 628 of the interconnect layers 606-610. The one or more interconnect layers 606-610 may form an interlayer dielectric (ILD) stack 619 of the IC device 600.

The interconnect structures 628 may be arranged within the interconnect layers 606-610 to route electrical signals according to a wide variety of designs (in particular, the arrangement is not limited to the particular configuration of interconnect structures 628 depicted in FIG. 6). Although a particular number of interconnect layers 606-610 is depicted in FIG. 6, embodiments of the present disclosure include IC devices having more or fewer interconnect layers than depicted.

In some embodiments, the interconnect structures 628 may include trench structures 628a (sometimes referred to as "lines") and/or via structures 628b filled with an electrically conductive material such as a metal. The trench structures 628a may be arranged to route electrical signals in a direction of a plane that is substantially parallel with a surface of the substrate 602 upon which the device layer 604 is formed. For example, the trench structures 628a may route electrical signals in a direction in and out of the page from the perspective of FIG. 6. The via structures 628b may be arranged to route electrical signals in a direction of a plane that is substantially perpendicular to the surface of the substrate 602 upon which the device layer 604 is formed. In some embodiments, the via structures 628b may electrically couple trench structures 628a of different interconnect layers 606-610 together.

The interconnect layers 606-610 may include a dielectric material 626 disposed between the interconnect structures 628, as shown in FIG. 6. In some embodiments, the dielectric material 626 disposed between the interconnect structures 628 in different ones of the interconnect layers 606-610 may have different compositions; in other embodiments, the composition of the dielectric material 626 between different interconnect layers 606-610 may be the same. In either case, such dielectric materials may be referred to as inter-layer dielectric (ILD) materials.

A first interconnect layer 606 (referred to as Metal 1 or "M1") may be formed directly on the device layer 604. In some embodiments, the first interconnect layer 606 may include trench structures 628a and/or via structures 628b, as shown. The trench structures 628a of the first interconnect layer 606 may be coupled with contacts (e.g., the S/D contacts 624) of the device layer 604.

A second interconnect layer 608 (referred to as Metal 2 or "M2") may be formed directly on the first interconnect layer 606. In some embodiments, the second interconnect layer 608 may include via structures 628b to couple the trench structures 628a of the second interconnect layer 608 with the trench structures 628a of the first interconnect layer 606. Although the trench structures 628a and the via structures 628b are structurally delineated with a line within each interconnect layer (e.g., within the second interconnect layer 608) for the sake of clarity, the trench structures 628a and the via structures 628b may be structurally and/or materially contiguous (e.g., simultaneously filled during a dual-damascene process) in some embodiments.

A third interconnect layer 610 (referred to as Metal 3 or "M3") (and additional interconnect layers, as desired) may be formed in succession on the second interconnect layer 608 according to similar techniques and configurations described in connection with the second interconnect layer 608 or the first interconnect layer 606.

The IC device 600 may include a solder resist material 634 (e.g., polyimide or similar material) and one or more bond pads 636 formed on the interconnect layers 606-610. The bond pads 636 may be electrically coupled with the interconnect structures 628 and configured to route the electrical signals of the transistor(s) 640 to other external devices. For example, solder bonds may be formed on the one or more bond pads 636 to mechanically and/or electrically couple a chip including the IC device 600 with another component (e.g., a circuit board). The IC device 600 may have other alternative configurations to route the electrical signals from the interconnect layers 606-610 than depicted in other embodiments. For example, the bond pads 636 may be replaced by or may further include other analogous features (e.g., posts) that route the electrical signals to external components.

Figure 7:
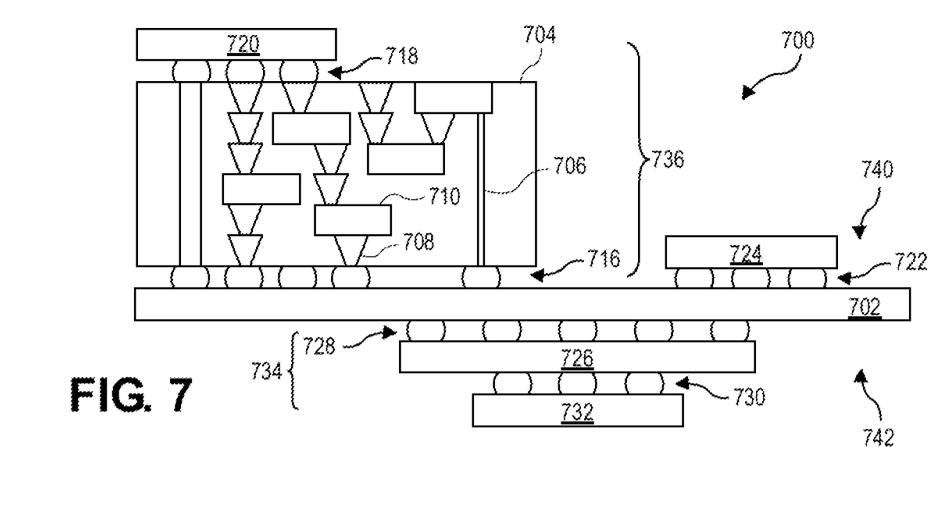
FIG. 7 is a cross-sectional side view of an integrated circuit (IC) device assembly that may include one or more TFTs fabricated using a spacer as a fin, in accordance with one or more of the embodiments disclosed herein.

FIG. 7 is a cross-sectional side view of an integrated circuit (IC) device assembly that may include one or more thin film fabricated using a spacer as a fin (e.g., a fin formed of a sidewall of channel material on a BB pillar after a spacer etch), in accordance with one or more of the embodiments disclosed herein.

Referring to FIG. 7, an IC device assembly 700 includes components having one or more integrated circuit structures described herein. The IC device assembly 700 includes a number of components disposed on a circuit board 702 (which may be, e.g., a motherboard). The IC device assembly 700 includes components disposed on a first face 740 of the circuit board 702 and an opposing second face 742 of the circuit board 702. Generally, components may be disposed on one or both faces 740 and 742. In particular, any suitable ones of the components of the IC device assembly 700 may include a number of the TFT structures disclosed herein.

In some embodiments, the circuit board 702 may be a printed circuit board (PCB) including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 702. In other embodiments, the circuit board 702 may be a non-PCB substrate.

The IC device assembly 700 illustrated in FIG. 7 includes a package-on-interposer structure 736 coupled to the first face 740 of the circuit board 702 by coupling components 716. The coupling components 716 may electrically and mechanically couple the package-on-interposer structure 736 to the circuit board 702, and may include solder balls (as shown in FIG. 7), male and female portions of a socket, an adhesive, an underfill material, and/or any other suitable electrical and/or mechanical coupling structure.

The package-on-interposer structure 736 may include an IC package 720 coupled to an interposer 704 by coupling components 718. The coupling components 718 may take any suitable form for the application, such as the forms discussed above with reference to the coupling components 716. Although a single IC package 720 is shown in FIG. 7, multiple IC packages may be coupled to the interposer 704. It is to be appreciated that additional interposers may be coupled to the interposer 704. The interposer 704 may provide an intervening substrate used to bridge the circuit board 702 and the IC package 720. The IC package 720 may be or include, for example, a die (the die 502 of FIG. 5B), an IC device (e.g., the IC device 600 of FIG. 6), or any other suitable component. Generally, the interposer 704 may spread a connection to a wider pitch or reroute a connection to a different connection. For example, the interposer 704 may couple the IC package 720 (e.g., a die) to a ball grid array (BGA) of the coupling components 716 for coupling to the circuit board 702. In the embodiment illustrated in FIG. 7, the IC package 720 and the circuit board 702 are attached to opposing sides of the interposer 704. In other embodiments, the IC package 720 and the circuit board 702 may be attached to a same side of the interposer 704. In some embodiments, three or more components may be interconnected by way of the interposer 704.

The interposer 704 may be formed of an epoxy resin, a fiberglass-reinforced epoxy resin, a ceramic material, or a polymer material such as polyimide. In some implementations, the interposer 704 may be formed of alternate rigid or flexible materials that may include the same materials described above for use in a semiconductor substrate, such as silicon, germanium, and other group III-V and group IV materials. The interposer 704 may include metal interconnects 708 and vias 710, including but not limited to through-silicon vias (TSVs) 706. The interposer 704 may further include embedded devices, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as radio-frequency (RF) devices, power amplifiers, power management devices, antennas, arrays, sensors, and microelectromechanical systems (MEMS) devices may also be formed on the interposer 704. The package-on-interposer structure 736 may take the form of any of the package-on-interposer structures known in the art.

The IC device assembly 700 may include an IC package 724 coupled to the first face 740 of the circuit board 702 by coupling components 722. The coupling components 722 may take the form of any of the embodiments discussed above with reference to the coupling components 716, and the IC package 724 may take the form of any of the embodiments discussed above with reference to the IC package 720.

The IC device assembly 700 illustrated in FIG. 7 includes a package-on-package structure 734 coupled to the second face 742 of the circuit board 702 by coupling components 728. The package-on-package structure 734 may include an IC package 726 and an IC package 732 coupled together by coupling components 730 such that the IC package 726 is disposed between the circuit board 702 and the IC package 732. The coupling components 728 and 730 may take the form of any of the embodiments of the coupling components 716 discussed above, and the IC packages 726 and 732 may take the form of any of the embodiments of the IC package 720 discussed above. The package-on-package structure 734 may be configured in accordance with any of the package-on-package structures known in the art.

Embodiments disclosed herein may be used to manufacture a wide variety of different types of integrated circuits and/or microelectronic devices. Examples of such integrated circuits include, but are not limited to, processors, chipset components, graphics processors, digital signal processors, micro-controllers, and the like. In other embodiments, semiconductor memory may be manufactured. Moreover, the integrated circuits or other microelectronic devices may be used in a wide variety of electronic devices known in the arts. For example, in computer systems (e.g., desktop, laptop, server), cellular phones, personal electronics, etc. The integrated circuits may be coupled with a bus and other components in the systems. For example, a processor may be coupled by one or more buses to a memory, a chipset, etc. Each of the processor, the memory, and the chipset, may potentially be manufactured using the approaches disclosed herein.

Figure 8:
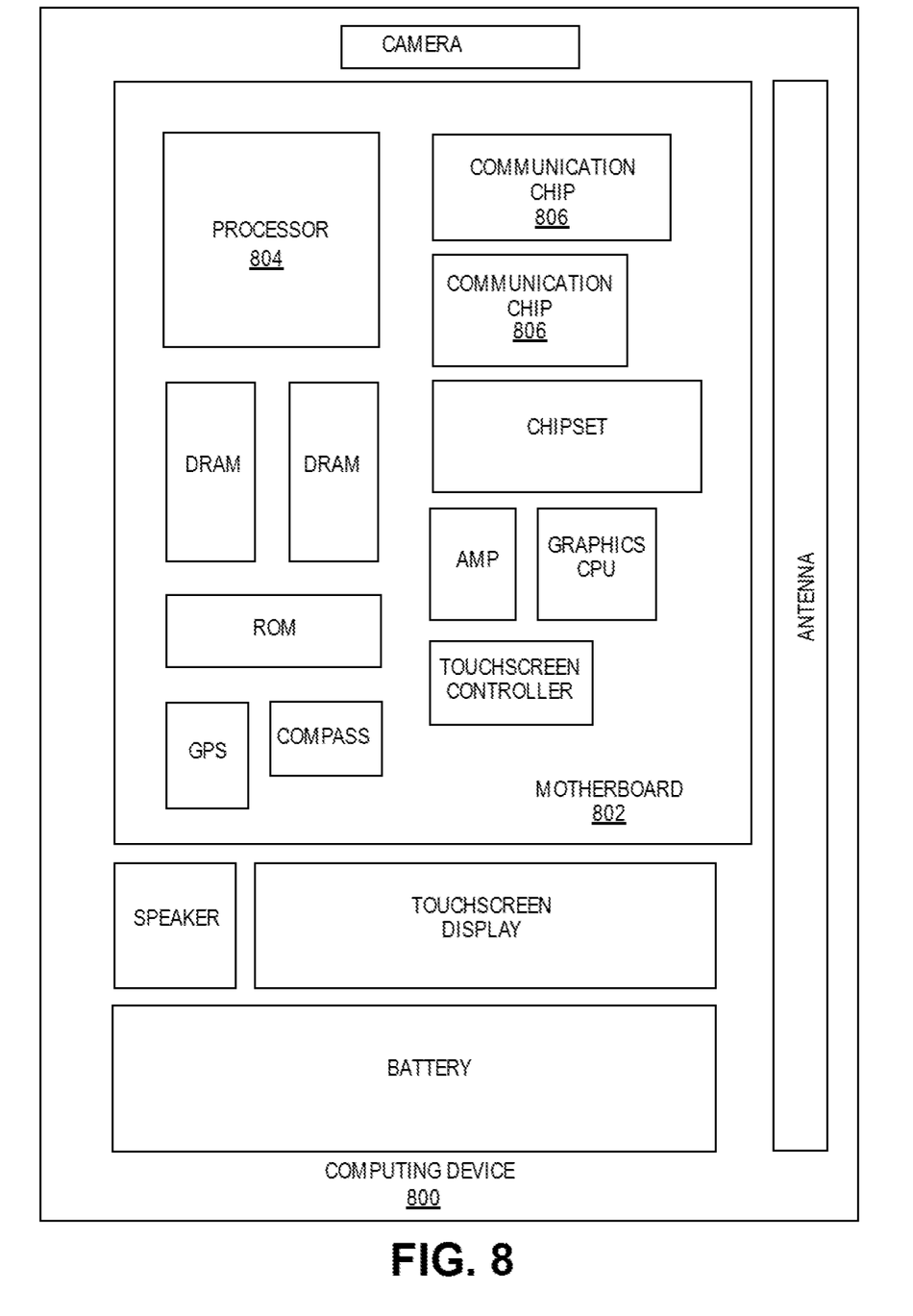
FIG. 8 illustrates a computing device in accordance with one implementation of an embodiment of the disclosure.

FIG. 8 illustrates a computing device 800 in accordance with one implementation of the disclosure. The computing device 800 houses a board 802. The board 802 may include a number of components, including but not limited to a processor 804 and at least one communication chip 806. The processor 804 is physically and electrically coupled to the board 802. In some implementations the at least one communication chip 806 is also physically and electrically coupled to the board 802. In further implementations, the communication chip 806 is part of the processor 804.

Depending on its applications, computing device 800 may include other components that may or may not be physically and electrically coupled to the board 802. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 806 enables wireless communications for the transfer of data to and from the computing device 800. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 806 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 800 may include a plurality of communication chips 806. For instance, a first communication chip 806 may be dedicated to shorter range wireless communications such as Wi-Fi and Bluetooth and a second communication chip 806 may be dedicated to longer range wireless communications such as GPS, EDGE, GPRS, CDMA, WiMAX, LTE, Ev-DO, and others.

The processor 804 of the computing device 800 includes an integrated circuit die packaged within the processor 804. In some implementations of the disclosure, the integrated circuit die of the processor includes one or more thin film transistors having a spacer as a fin, in accordance with implementations of embodiments of the disclosure. The term "processor" may refer to any device or portion of a device that processes electronic data from registers and/or memory to transform that electronic data into other electronic data that may be stored in registers and/or memory.

The communication chip 806 also includes an integrated circuit die packaged within the communication chip 806. In accordance with another implementation of embodiments of the disclosure, the integrated circuit die of the communication chip includes one or more thin film transistors having one or more thin film transistors fabricated using a spacer as a fin, in accordance with implementations of embodiments of the disclosure.

In further implementations, another component housed within the computing device 800 may contain an integrated circuit die that includes having one or more thin film transistors fabricated using a spacer as a fin, in accordance with implementations of embodiments of the disclosure.

In various implementations, the computing device 800 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 800 may be any other electronic device that processes data.

Thus, embodiments described herein include thin film transistors having one or more thin film transistors fabricated using a spacer as a fin.

Example 1 may include a method of forming a fin transistor structure, comprising: patterning a plurality of backbone pillars on a semiconductor substrate; conformally depositing a spacer layer over the plurality of backbone pillars and the semiconductor substrate; and performing a spacer etch of the spacer layer to leave a sidewall of the spacer layer on a backbone pillar to form a fin of the fin transistor structure.

Example 2 may include the method of Example 1, wherein conformally depositing the spacer layer includes conformally depositing a channel material over the plurality of backbone pillars.

Example 3 may include the method of Example 2, wherein the channel material is selected from one or more of a semiconductor material comprising oxides, sulphides, selenides, nitrides or carbides including one more of indium, gallium, zinc, tin, titanium, ruthenium, and tungsten, molybdenum, copper, niobium, nickel, lead, tantalum, and hafnium.

Example 4 may include the method of Example 1, wherein the plurality of backbone pillars include one or more of silicon (Si), silicon nitride (SiN). silicon oxide ($SiO_2$), carbon (C), silicon carbide (SiC), silicon oxynitride (SiON), and carbon-doped oxide (CDO).

Example 5 may include the method of Example 1, further comprising after performing the spacer etch of the spacer layer, etching the plurality of backbone pillars to remove the backbone pillars.

Example 6 may include the method of Example 1, further comprising after performing the spacer etch of the spacer layer, allowing the plurality of backbone pillars to remain as a support for the fin.

Example 7 may include the method of Example 1, wherein a height of the fin is substantially sloped across a top of the fin.

Example 8 may include the method of Example 1, wherein a height of the fin is higher on a side facing a location or former location of a backbone pillar of the plurality of backbone pillars.

Example 9 may include a integrated circuit structure, comprising: a fin transistor structure; and a semiconductor substrate on which the fin transistor structure is formed, wherein a sidewall of channel material on a backbone pillar after a spacer etch forms the fin of the fin transistor structure.

Example 10 may include the integrated circuit structure of Example 9, wherein the channel material forming the fin is selected from one or more of a semiconductor material comprising oxides, sulphides, selenides, nitrides or carbides including one more of indium, gallium, zinc, tin, titanium, ruthenium, and tungsten, molybdenum, copper, niobium, nickel, lead, tantalum, and hafnium.

Example 11 may include the integrated circuit structure of Example 9, wherein a height of the fin is sloped across a top of the fin.

Example 12 may include the integrated circuit structure of Example 9, wherein a height of the fin is higher on a side facing a location or former location of the backbone pillar.

Example 13 may include the integrated circuit structure of Example 9, wherein the backbone pillar is included in a plurality of backbone pillars over which a spacer layer of the channel material is deposited prior to the spacer etch.

Example 14 may include the integrated circuit structure of Example 9, wherein the backbone pillar is removed after the spacer etch.

Example 15 may include the integrated circuit structure of any one of Examples 9-14, wherein the integrated circuit structure comprises a tri-gate transistor and the backbone pillar remains to provide support for the fin of the tri-gate transistor.

Example 16 includes a computing device, comprising: a board; and a component coupled to the board, the component including an integrated circuit structure, comprising: a fin transistor structure; and a semiconductor substrate on which the fin transistor structure is formed, wherein a sidewall of channel material on a backbone pillar after a spacer etch forms the fin of the fin transistor structure.

Example 17 may include the computing device of Example 16, wherein the backbone pillar is removed after the spacer etch.

Example 18 may include the computing device of Example 16, further comprising a communication chip coupled to the board.

Example 19 may include the computing device of Example 16, further comprising: a memory coupled to the board.

Example 20 may include the computing device of any of Examples 16-19, wherein the component is a packaged integrated circuit die.

The above description of illustrated implementations of embodiments of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize.

These modifications may be made to the disclosure in light of the above detailed description. The terms used in the following claims should not be construed to limit the disclosure to the specific implementations disclosed in the specification and the claims. Rather, the scope of the disclosure is to be determined entirely by the following claims, which are to be construed in accordance with established doctrines of claim interpretation.

What is claimed is:

1. A method of forming a fin transistor structure, comprising:
   patterning a plurality of backbone pillars on a semiconductor substrate;
   conformally depositing a spacer layer over the plurality of backbone pillars and the semiconductor substrate; and
   performing a spacer etch of the spacer layer to leave a first sidewall and a second sidewall of the spacer layer on a backbone pillar to form a first fin and a second fin, respectively, of the fin transistor structure, wherein the first fin has a first side higher than a second side, and the second fin has a first side higher than a second side, and wherein the first side of the first fin faces toward the first side of the second fin.

2. The method of claim 1, wherein conformally depositing the spacer layer includes conformally depositing a channel material over the plurality of backbone pillars.

3. The method of claim 2, wherein the channel material is selected from one or more of a semiconductor material comprising oxides, sulphides, selenides, nitrides or carbides including one more of indium, gallium, zinc, tin, titanium, ruthenium, and tungsten, molybdenum, copper, niobium, nickel, lead, tantalum, and hafnium.

4. The method of claim 1, wherein the plurality of backbone pillars include one or more of silicon (Si), silicon nitride (SiN), silicon oxide (SiO$_2$), carbon (C), silicon carbide (SiC), silicon oxynitride (SiON), and carbon-doped oxide (CDO).

5. The method of claim 1, further comprising after performing the spacer etch of the spacer layer, etching the plurality of backbone pillars to remove the backbone pillars.

6. The method of claim 1, further comprising after performing the spacer etch of the spacer layer, allowing the plurality of backbone pillars to remain as a support for the first fin and the second fin.

7. An integrated circuit structure, comprising:
   a substrate; and
   a fin transistor structure above the substrate, the fin transistor structure comprising a first fin and a second fin of a channel material, wherein the first fin has a first side higher than a second side, and the second fin has a first side higher than a second side, and wherein the first side of the first fin faces toward the first side of the second fin.

8. The integrated circuit structure of claim 7, wherein the channel material is selected from one or more of a semiconductor material comprising oxides, sulphides, selenides, nitrides or carbides including one more of indium, gallium, zinc, tin, titanium, ruthenium, and tungsten, molybdenum, copper, niobium, nickel, lead, tantalum, and hafnium.

9. The integrated circuit structure of claim 7, wherein a backbone pillar is between the first fin and the second fin.

10. The integrated circuit structure of claim 9, wherein the integrated circuit structure comprises a tri-gate transistor and the backbone pillar remains to provide support for the tri-gate transistor.

11. A computing device, comprising:
    a board; and
    a component coupled to the board, the component including an integrated circuit structure, comprising:
    a substrate; and
    a fin transistor structure above the substrate, the fin transistor structure comprising a first fin and a second fin of a channel material, wherein the first fin has a first side higher than a second side, and the second fin has a first side higher than a second side, and wherein the first side of the first fin faces toward the first side of the second fin.

12. The computing device of claim 11, wherein the further comprising a backbone pillar between the first fin and the second fin.

13. The computing device of claim 11, further comprising a communication chip coupled to the board.

14. The computing device of claim 11, further comprising: a memory coupled to the board.

15. The computing device of claim 11, wherein the component is a packaged integrated circuit die.

* * * * *